United States Patent [19]
Allen et al.

[11] Patent Number: 4,797,696
[45] Date of Patent: Jan. 10, 1989

[54] BEAM SPLITTING APPARATUS

[75] Inventors: Paul C. Allen, Beaverton; Paul A. Warkentin, Aloha, both of Oreg.

[73] Assignee: ATEQ Corporation, Beaverton, Oreg.

[21] Appl. No.: 98,565

[22] Filed: Sep. 21, 1987

Related U.S. Application Data

[63] Continuation of Ser. No. 867,205, May 27, 1986, abandoned, which is a continuation of Ser. No. 758,344, Jul. 24, 1985, abandoned.

[51] Int. Cl.$^4$ .................... G03B 41/00; G02B 27/14
[52] U.S. Cl. .......................................... 354/4; 350/172
[58] Field of Search ............... 350/172, 173; 354/4, 354/5; 355/53

[56] References Cited

U.S. PATENT DOCUMENTS 3,230,851  1/1966  Reymond ........................... 350/172
3,898,639  8/1975  Muncheryan ................... 350/172 X
4,531,054  7/1985  Suzuki ............................. 350/172 X
4,541,712  9/1985  Whitney ................................ 355/53

FOREIGN PATENT DOCUMENTS 112188  6/1984  European Pat. Off. ............ 350/172

Primary Examiner—W. B. Berkey
Attorney, Agent, or Firm—Blakely, Sokoloff, Taylor & Zafman

[57] ABSTRACT

An apparatus for splitting radiant energy beams produced by a laser or other light source. The apparatus comprises a plurality of mirrors, each aligned to reflect a beam or plurality of beams from one mirror to the next. Each mirror comprises a glass body with a layer of 50% reflective coating and a layer of anti-reflecting coating on one side of the body. A layer of 100% reflective coating is on the other side of the body. A beam is, thus, 50% reflected from the first reflective layer and allowed 50% to pass through the layer. The remainder of the beam is reflected from the 100% reflective layer.

14 Claims, 4 Drawing Sheets

… …

BEAM SPLITTING APPARATUS

This is a continuation of application Ser. No. 867,205 filed May 27, 1986, abandoned, which is a continuation of application Ser. No. 758,344, filed July 24, 1985, now abandoned.

BACKGROUND OF THE INVENTION

1. Field of the Invention

The invention relates to the field of beam splitting means for use with laser beam apparatus and the like and has particular application in the field of pattern generation using a laser and radiant energy film in photolithography.

2. Prior Art

A number of beam splitting apparatus are known in the art. In a common embodiment, mirrors are employed as a beam splitting means. It is an object of the beam splitting apparatus of the present invention to reduce the number of mirrors utilized in the prior art and still achieve the same direction and number of beams.

SUMMARY OF THE INVENTION

An apparatus for splitting radiant energy beams produced by a laser or other light source is described. The apparatus comprises a plurality of mirrors, each aligned to reflect a beam or plurality of beams from one mirror to the next. The mirror comprises a glass body with a layer of 50% reflective coating and a layer of anti-reflecting coating on one side of the body. A layer of 100% reflective coating is on the other side of the body. A beam is, thus, 50% reflected from the first reflective layer and allowed to 50% pass through the layer. The remainder of the beam is reflected from the 100% reflective layer.

DETAILED DESCRIPTION OF THE INVENTION

A beam splitting apparatus is described. The preferred embodiment of the present invention is embodied in a laser pattern generating apparatus which is particularly suitable for selectively exposing photosensitive layers such as photoresist used in the fabrication of integrated circuits. In the following description, numerous specific details are set forth such as specific wavelengths, lenses, etc., in order to provide a thorough understanding of the present invention. It will be obvious, however, to one skilled in the art that the present invention may be practiced without these specific details. In other instances, well-known structures, support members, etc., not necessary to the present invention, are not been set forth in detail in order not to unnecessarily obscure the present invention.

OVERVIEW OF AN APPARATUS EMBODYING THE PRESENT INVENTION

The pattern generation apparatus utilizing the present invention uses a laser beam to expose a radiant sensitive film. The laser beam is split into eight beams to create a brush. The brush scans the workpiece through use of a rotating mirror. Each beam of the brush is modulated through acousto-optical modulators. The electrical signals coupled to these modulators determine the specific pattern which is generated. The "rasterizer" system used for providing the electrical signals to the modulators is described in copending application, Ser. No. 784,856, filed Oct. 4, 1985 which is assigned to the assignee of the present invention.

The workpiece containing the photosensitive film is mounted on a movable table which moves in one axis during scanning (stripe axis). The table also moves in the scan axis when writing is not occurring. Interferometers detect movement of the workpiece in these axes. A determination of workpiece position relative to beam position is made from reflected light in a telecentric enlarged image plane. This same image plane is used for mirror facet detection, thus permitting data synchronization to the acousto-optical modulators.

OPTICAL PATH OF AN APPARATUS EMBODYING THE PRESENT INVENTION

Figure 1:
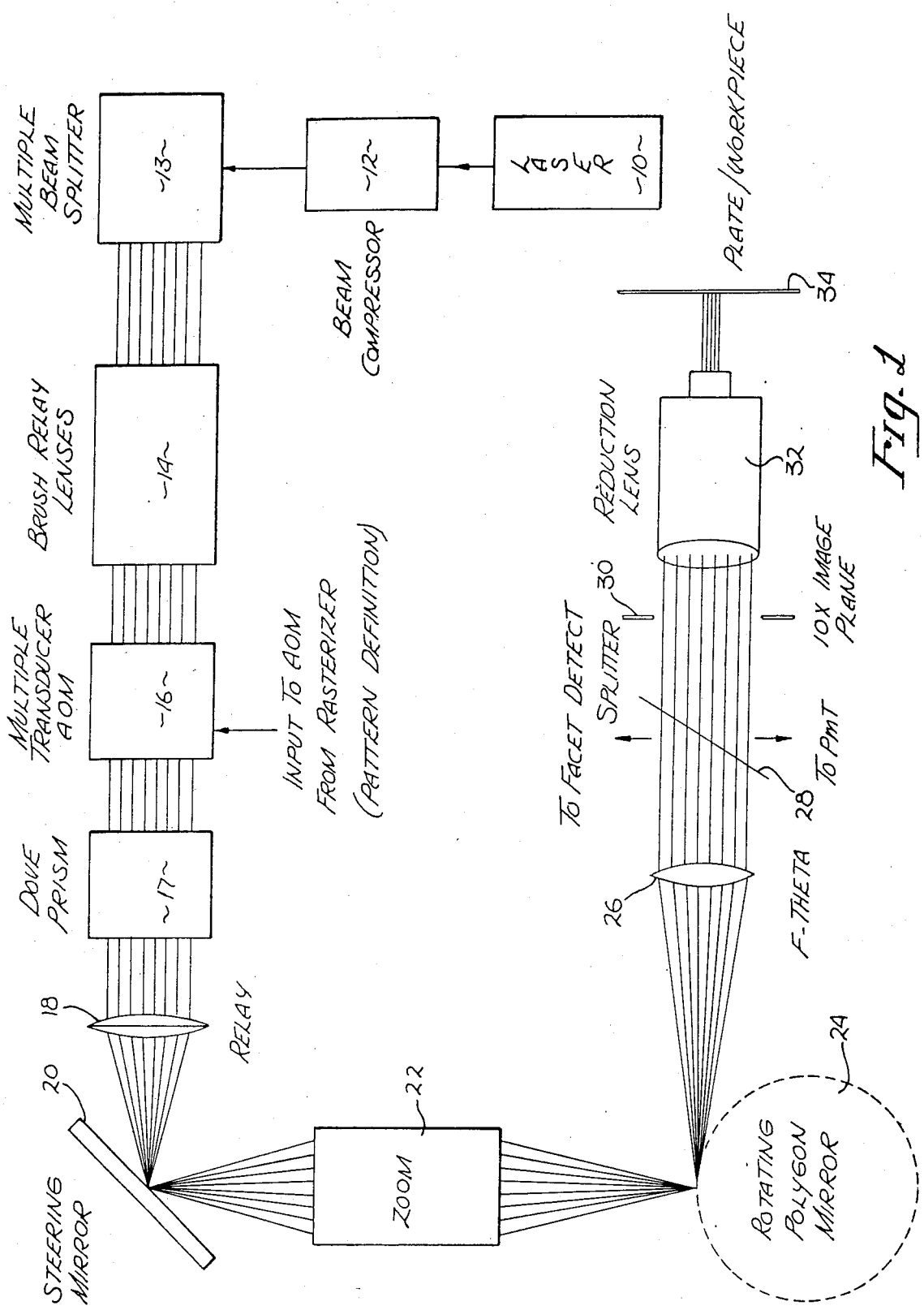
FIG. 1 is an optical schematic showing the overall optical path of an apparatus embodying the preferred embodiment of the present invention.

Referring to FIG. 1 in the currently preferred embodiment a continuous wave laser 10 providing 100–200 milliwatts of radiation at a frequency of 363.8 nm is used. The beam from laser 10 is compressed through ordinary beam compressor 12 to prepare the beam for splitting.

The multiple beam splitter 13 splits the beam from the laser 10 into eight beams. The specific optical arrangement for providing this splitting is described in conjunction with FIGS. 3 and 4.

The eight beams from the splitter 13 (sometimes referred to collectively as the "brush") passes through the relay lenses 14. This three element lens (shown in FIG. 2), in effect, focuses and shrinks the beams from the splitter 13 by approximately a factor of two.

Commercially available acousto-optical modulators (AOMs) 16 are employed to modulate the light beams. In the presently preferred embodiment, eight transducers are formed on the surface of a single crystal. A carrier of 160 MHz is used, that is, the presence of the carrier determines whether the beam will be diffracted through the crystal onto the workpiece; the amplitude of the carrier determines the intensity of the beam. (The zero order beam is not used.)

Eight modulated beams may be obtained from a single beam using a single AOM where eight carrier frequencies are used. The deflection from the AOM is a function of frequency and each carrier frequency creates a separate beam. Alternatively, electro-optic modulators may be employed in place of the AOMs. Neither of these are used in the currently preferred embodiment.

The eight beams from the AOM are directed through a dove prism 17. This prism is used to rotate the brush of beams, and while not easily demonstrable in the view of FIG. 1, the beams, in effect, are tilted out of the plane of the figure. The ultimate brush formed by the beams comprises overlapping projections of each of the beams without interference between the beams since in addition to the rotation from prism 17, a time delay is used between the activation of each of the beams. If this is not done non-uniform exposure of the photoresist can result.

The beams from prism 17 pass through the single relay lens 18 to converge to a spot on the steering mirror 20. In the currently preferred embodiment, this spot is approximately 1.5 mm in diameter. The steering mirror 20 is an electrically controllable mirror which permits the beams' angles to be moved (adjusted) on the facets comprising mirror 24. The beams reflecting from mirror 20 pass through the zoom lens 22 which comprises four elements shown in FIG. 2. This zoom lens permits the beams to be made larger and moved further apart or to be made smaller and closer together on the workpiece. This zoom is electrically controlled and is set for each workpiece.

The rotating polygon mirror 24 in the currently preferred embodiment comprises 24 facets each of which deflect the beams from the zoom lens 22 into the F-theta lens 26. It is this mirror which provides the scanning action of the beams. In the currently preferred embodiment, this mirror rotates between 12,000 to 20,000 rpms; thus, the scans occur at a rate between 48 kHz and 80 kHz per second. However, the mirror rotates at a constant rate for a given pattern.

The beams from mirror 24 are enlarged in a post-scan, intermediate image plane (10×image plane) as shown in FIG. 1. At one end of this plane, F-theta lens 26 is used to form the plane and at the other end a reduction lens 32 is used to provide the final beams. The final reduced beam scans the plate or workpiece 34.

A splitter 28 is disposed in the 10× image plane. As will be described later, one of the beams is activated prior to each scan and is used to detect the mirror facets. The beam is reflected from splitter 28 to a facet detect circuit which provides a pulse indicating facet position. This permits the pattern data to the AOM 16 to be synchronized with the mirror rotation. Reflections from the workpiece 34 (or its part holder) are also reflected by the splitter 28 and focused into a photomultiplier tube. These reflections are used for calibration and other purposes as will be described later.

A shutter 30 operates in the 10× image plane. This shutter prevents light from reaching the workpiece except during scanning or other selected times such as at calibration.

Figure 2:
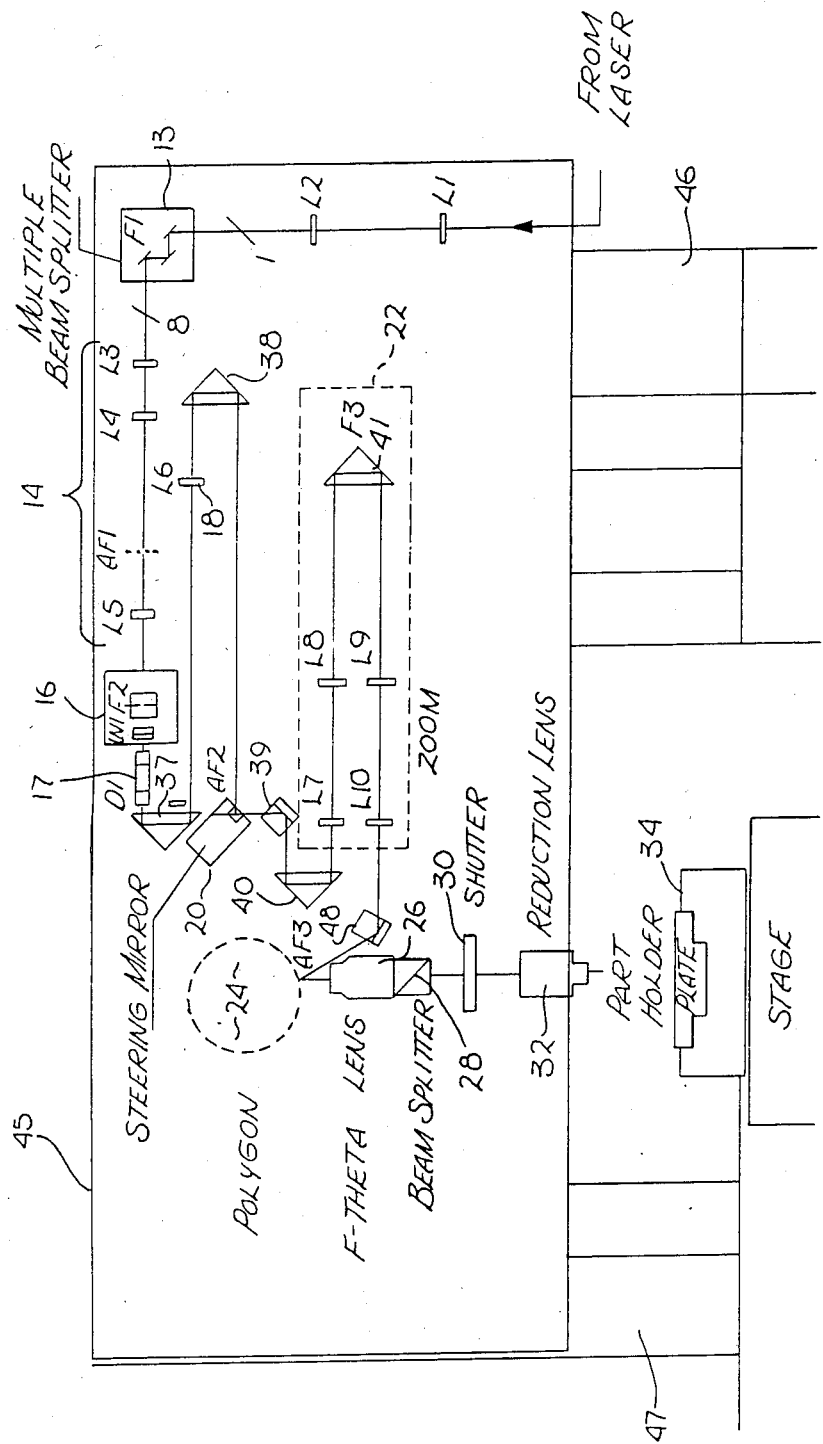
FIG. 2 is an elevation view of a laser pattern generation apparatus embodying the preferred embodiment of the present invention.

In FIG. 2 the actual optical path as currently realized is shown. The laser, lenses, rotating mirror, etc., are mounted to a rigid metal frame 45. The frame is supported by metal supports 46 and 47 which are mounted on a single granite member to minimize movement. The workpiece or plate is secured on the part holder and this assembly, as will be described, moves below the reduction lens 32.

In the optical path of FIG. 2, the designation "L" refers to lenses, the designation "F" refers to focal points, and the designation "AF" refer to afocal points.

The beam from the laser passes through lenses L1 and L2 which are the beam compressor 12 shown in FIG. 1. The beam is then focused into the beam splitter 13 which, as mentioned, will be described later with FIGS. 3 and 4.

The relay lenses 14 of FIG. 1 are formed by lenses L3, L4 and L5 which include the afocal point AF1 between lenses L4 and L5. The AOM 16 is again shown and receives the eight beams from the lenses 14. The modulated light from the AOM passes through the dove prism 17 and then through the beam folding prism 37, relay lens 18 (L6), beam folding prism 38, and onto the steering mirror 20. From there the beams are reflected from mirror 39, pass through the beam folding prism 40 and are directed to the zoom lens assembly which comprises lenses L7, L8, L9, L10 and the beam folding prism 41. A focal point F3 is located within the prism 41. The beams from the zoom lens assembly then are reflected by mirror 48 onto the rotating mirror (polygon) 24.

The post-scan optics are again shown in FIG. 2 which includes the F-theta lens 26, the beam splitter 28, shutter 30 and reduction lens 32.

All the lenses discussed above are commercially obtainable.

BEAM SPLITTER 13 OF FIGS. 1 AND 2

Figure 4:
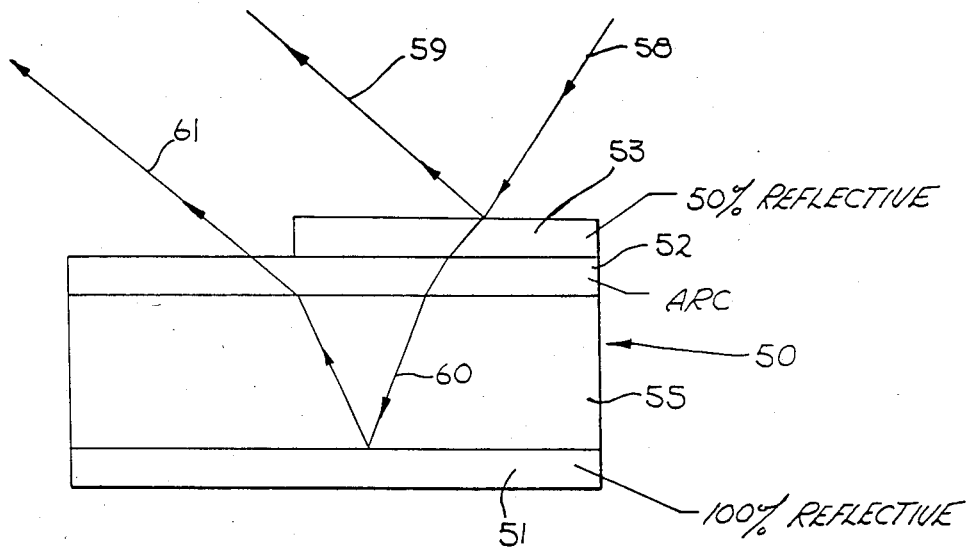
FIG. 4 is an elevation view of one of the beam splitters used in the beam splitter of the present invention.

FIG. 4 shows one of the three similar plates 50 used in the beam splitter. The body 55 is an ordinary body such as glass which transmits the beam. The upper surface of the body includes an anti-reflective coating 52. Partially covering this coating is a 50% reflective coating or layer 53. On the lower surface of body 55 a 100% reflective coating or layer 51 is formed.

As is seen, a beam 58 incident on layer 53 is reflected as shown by beam 59. A portion of the beam 58 shown as beam 60 enters the body 55 and is reflected from the coating 51 (beam 61). Note that the beam 61 upon exiting the plate 50 does not strike the layer 53.

Figure 3:
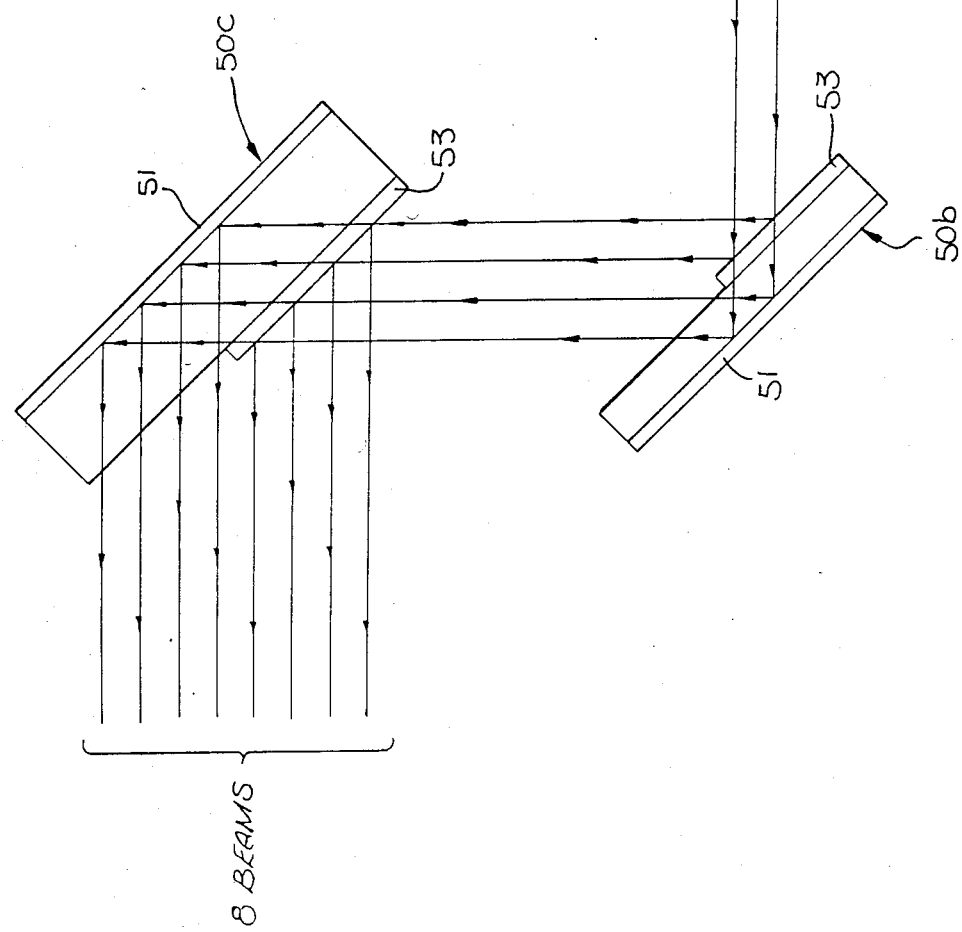
FIG. 3 is a diagram of the beam splitter of the present invention.

Three plates such as plate 50 of FIG. 4 are shown in FIG. 3 (plates 50a, 50b and 50c) and are used to provide eight beams in the presently preferred embodiment. Plate 50b is twice as thick as plate 50a; plate 50c is twice is thick as plate 50b. The plates are mounted parallel to one another in the currently preferred embodiment.

As seen in FIG. 3 a beam 63 first striking plate 50a provides two beams. (This is also shown in FIG. 4.) The two beams are then incident on the layer 53 of plate 50b. Half of each of these beams is reflected from layer 53. The portions of the beams which pass through layer 53 are reflected by layer 51 to provide two additional beams, thus a total of four beams leave the plate 50b. In a similar fashion, all four beams from plate 50b are partly reflected from the layer 53 of plate 50c and four beams are reflected from layer 51 of plate 50c to provide the eight beams used in the presently preferred embodiment.

Thus, a beam splitter apparatus has been described.

We claim:

1. An apparatus for operating a pattern on a workpiece comprising:
    a laser for providing a radiant energy beam;
    beam splitting means optically coupled to said laser, comprising a first beam splitting mirror for receiving said beam from said laser, and for splitting said beam into two beams, said first beam splitting mirror comprising a body and a first and second reflective layer;
    said first reflective layer covering approximately one half of one side of said body and generally parallel with said second reflective layer;
    modulation means for independently modulating each of said plurality of beams, said modulation means being optically coupled to said beam splitting means.

2. An apparatus, as recited by claim 1, wherein said beam splitting means further includes a second beam splitting mirror for receiving said two beams from said from said first mirror and for splitting said two beams into four beams, and a third beam splitting mirror for receiving said four beams from said second mirror and for splitting said four beams into eight beams.

3. An apparatus for generating a pattern on a workpiece, comprising:
  a beam generating means for providing a radiant energy beam;
  a beam splitting means optically coupled to said beam generation means comprising a first beam splitting mirror for receiving said beam from said laser and for splitting said beam into two beams, said first beam splitting mirror comprising:
  a body;
  a first reflective layer covering a first portion of a first surface of said body, said body not covered by said first reflective layer on a second portion of said first surface of said body;
  a second reflective layer covering at least a second portion of a second surface of said body, said second reflective layer being generally parallel with said first reflective layer.

4. The apparatus, as recited by claim 3 wherein said beam splitting means further comprises a second beam splitting mirror for receiving said two beams from said first mirror and for splitting said two beams into four beams, and a third beam splitting mirror for receiving said four beams from said second mirror and for splitting said four beams into eight beams.

5. The apparatus, as recited by claim 3, wherein said first mirror further comprises:
  a second surface of said body being coated with a second reflective layer, said second surface being generally parallel to said first surface.

6. The apparatus, as recited by claim 5, wherein said body is comprised of glass.

7. The apparatus, as recited by claim 5, wherein said first reflective layer is approximately 50% reflective.

8. The apparatus, as recited by claim 5, wherein said second reflective layer is approximately 100% reflective.

9. In an apparatus for splitting a radiant energy beam, said radiant energy beam being generated by a laser or other source, an improvement comprising:
  a first beam splitting means for splitting said beam into a plurality of beams, said first beam splitting means comprising:
   (1) a transparent body;
   (2) a first reflective layer coupled with said body for partially reflecting said beam, said first reflective layer partially covering a first surface of said transparent body;
   (3) a second reflective layer for reflecting said beam coupled with said body, said second reflective layer being generally parallel with said first reflective layer;
  whereby, a beam entering said first beam splitting means is split into a plurality of beams.

10. The improvement, as recited in claim 9, wherein said first beam splitting means further comprises an anti-reflective layer coupled with said body and said first reflective layer.

11. The improvement, as recited by claim 10, wherein said first reflective layer is approximately 50% reflective.

12. The improvement, as recited by claim 11, wherein said second reflective layer is approximately 100% reflective.

13. The improvement, as recited by claim 12, wherein said body is comprised of glass.

14. The improvement, as recited by claim 13, wherein said beam splitting apparatus further comprises a second and third beam splitting means.

* * * * *